United States Patent

Beyma et al.

[11] Patent Number: 4,990,897
[45] Date of Patent: Feb. 5, 1991

[54] METHOD AND APPARATUS FOR DETECTING AND RECOGNIZING IMPACTS BY MEASURING IMPEDANCE VARIATION

[75] Inventors: Alain R. Beyma, Marseille; Manuel J. Garcia, 2, Avenue Pacifique Rovali, 13830 Roquefort la Bedoule, both of France

[73] Assignee: Manuel J. Garcia, La Bedoule, France

[21] Appl. No.: 356,796

[22] Filed: May 24, 1989

[30] Foreign Application Priority Data

May 30, 1988 [FR] France .................. 88 07319

[51] Int. Cl.⁵ .......................................... G08B 21/00
[52] U.S. Cl. ................................ 340/665; 340/323 R; 340/541
[58] Field of Search .......... 340/665, 562, 323 R, 340/561, 565, 541; 324/61 R, 65 R

[56] References Cited

U.S. PATENT DOCUMENTS

| | | | |
|---|---|---|---|
| 4,062,008 | 12/1977 | Carlsson | 340/323 R |
| 4,289,035 | 9/1981 | Lee | 73/708 |
| 4,855,711 | 8/1989 | Harrop et al. | 340/665 X |

FOREIGN PATENT DOCUMENTS

| | | |
|---|---|---|
| 2529475 | 1/1977 | Fed. Rep. of Germany . |
| 8706280 | 7/1987 | Fed. Rep. of Germany . |
| 7639183 | 10/1977 | France . |
| 7903843 | 9/1979 | France . |
| 2013434 | 8/1979 | United Kingdom . |

OTHER PUBLICATIONS

8013 Journal of the Audio Engineering Society; 33 (1985), Jun., No. 6, New York, U.S.A.: J. A. M. Catrysse; pp. 430–435.

Primary Examiner—Glen R. Swann, III
Assistant Examiner—Thomas J. Mullen, Jr.
Attorney, Agent, or Firm—Ladas & Parry

[57] ABSTRACT

The present invention relates to a method and apparatus for detecting and for recognizing impacts by measuring changes in impedance. The device comprises a sensor (6) and an external electronic system (10) which permanently monitors the impedance of the sensor. After a learning period, the electronic system records the impedance of the apparatus at rest, after which, whenever the sensor is subjected to an external action (9), its impedance varies at a certain rate of change, thereby enabling the electronic system to detect the derivative of the rate of change of the impedance, or in a different application to detect the pure change in impedance, and transmit a signal to a user (16). The sensor (6) is constituted by a flexible outer surface (3) protecting two optionally flexible layers (1 and 2) of electrically conductive material which are optionally in contact with each other and which have electrical contacts (7) formed thereon and connected via electrically conductive wires (4) to the external electronic system (10).

9 Claims, 1 Drawing Sheet

METHOD AND APPARATUS FOR DETECTING AND RECOGNIZING IMPACTS BY MEASURING IMPEDANCE VARIATION

DESCRIPTION

The present invention relates to a method and apparatus for detecting and recognizing impacts by measuring impedance variation.

The technical field of the invention is manufacturing sensors for association with measuring and calculating apparatus for detecting, and above all for recognizing, impacts over the entire area fitted with a sensor.

BACKGROUND OF THE INVENTION

One of the main applications of the invention relates to any occasion when premises are under surveillance for the purpose of triggering some type of alarm on detecting a predetermined intrusion into the premises; other applications include fluid mechanics, and making artificial skins.

Another application is utilization in sport, e.g. whenever there is a need to detect whether a ball strikes on or outside a given line, as in tennis, while avoiding disturbances due to other types of impact, such as those from the feet of the players.

Various detection devices and methods are known that make use of various techniques: some of them are active in that they emit waves e.g. light waves or sound waves or electromagnetic waves, and they detect any mass or object (whether identified or not) moving or taking up a position in the space under surveillance by the waves by virtue of the waves being reflected.

Other devices are passive in nature: they do not emit any wave or signal in the absence of a disturbance and they trigger only in the event of a change of state in a parameter under surveillance (e.g. temperature, pressure, contact, luminosity, noise, etc. . . . ).

All of these methods and corresponding apparatuses satisfy a given utilization given the desired detection criteria, and each has its own degree of quality and reliability. In particular, when it is desired, as in the present invention, to detect impacts, use is made essentially either of simple on/off contact systems which trigger at a predetermined threshold of contact displacement, or else of measuring sensors which make it possible to attempt to find out more about variation in a physical parameter such as pressure, so as to have a quantitative measurement of an impact on the basis of which various actions may be triggered.

In this field, mention may be made of a patent application filed Feb. 15, 1978 in the United States under the number 878 056 by "The Bendix Corporation" and describing "An assembly including a capacitive sensor and a demodulation circuit", with the claims thereof bearing essentially on the circuit which is required to compensate for variations in the output signal produced by system errors. It is known that any measurement of the capacitance in a circuit is a function, in particular, both of the temperature and of the humidity of the medium. It is therefore necessary in apparatuses and sensors of this type to make corrections therefor in order to compare pressure measurements under the same conditions.

Various other patent applications have been filed for other types of capacitive sensor, e.g. an application made by S.I.E. GmbH in West Germany on May 1, 1987, under the number G 87 06 280.1, describing a sensor including three flexible electrodes and an electronic circuit delivering a signal which is a function of the deformation of said electrode and due, for example, to variation in the pressure on the sensor.

In order to obtain information not only at a point, but also over an area, various sensors have been developed for detecting deformations therein by using electrical measurements. French patent application No. 75/34.225 filed Nov. 5, 1975 by the French national agency for promoting research "AGENCE NATIONALE DE VALORISATION POUR LA RECHERCE A.N.-V.A.R.", describes a touch sensor for the purpose of creating "an artificial skin" and comprising a multitude of measuring electrodes and conductor elements intermeshed between one another and embedded in a material whose electrical conductivity depends on the extent to which it is compressed.

Other patent applications could be mentioned relating to various other apparatuses for the purpose of measuring the pressure to which a support is subjected under the effect of a load, for example, and based on capacitive circuits.

The present invention lies in this category of apparatuses, and more especially it lies in the category of apparatuses for detecting impacts and for recognizing such impacts over areas of a certain extent in order to trigger selective actions.

Most of the above-mentioned systems are based:

either on active measurement by emitting waves whose reflection is essentially an on/off type of phenomenon providing all-or-nothing detection; or if such methods are required to provide finer distinctions or quantitative measurements, then very complex and expensive signal-shaping and calculating circuits are required;

or else on passive measurements in which a magnitude is calculated, which magnitude can then be quantified in order to interpret its cause, and a qualitative analysis may be made thereof in order to select the desired action; however reliability is poor and adjustment must be performed on a permanent basis.

None of these systems can thus be used for detecting impacts, under any situation and environmental conditions, while simultaneously, and above all, recognizing such impacts without using apparatus which is complex or which requires adjustment on a permanent basis.

One of the problems encountered is to be able to detect and select, in particular over a given area, at least one type of impact as previously defined, and to detect that type of impact only, under all circumstances and regardless of the state of said surface at the moment of impact.

SUMMARY OF THE INVENTION

One solution to the problem is provided by a method of detecting and recognizing impacts received by a surface, the method comprising the following operations:

at least two layers of electrically conductive material are disposed in contact with each other in order to constitute a sensor, and said surface is covered therewith;

each of the outer layers is connected to a corresponding terminal of an electronic system including at least one constant current generator, said current then flowing through said layers, a microprocessor associated with at least one memory and suitable, in particular, for measuring the potential difference at the terminals of said sensor, and various input/output interfaces;

the rate of change of the impedance of said sensor is calculated, which impedance changes when the sensor is subjected to a physical phenomenon which differs from its initial situation, said rate of change of impedance being directly proportional to the derivative of the measured potential difference; and during an initial learning stage said memory of the electronic system is used to store the "rest" impedance value of the sensor corresponding to a given initial situation, and on each change in said impedance during a utilization stage, said microprocessor (which is appropriately programmed for the purposes) addresses a given signal via an output interface whenever said rate of change exceeds a given threshold.

Another solution to the problem is provided by apparatus for detecting and recognizing impacts received by a surface, the apparatus being of the type comprising a pressure sensor associated with an electronic system for the purpose of measuring the impedance of said sensor, wherein said sensor is constituted by at least two layers of electrically conductive material, disposed in contact against each other and covering said surface, with each of the outer layers being connected at at least one arbitrary point on its surface to a terminal of said electronic system. The electronic system includes at least one constant current generator for feeding a constant current through said layers, a microprocessor associated with at least one memory and serving, in particular, to measure the potential difference across the terminals of said sensor, to calculate the derivative of said potential difference, to compare the results obtained with derivative values stored in said memory and each associated with a prior-determined type of impact, and to transmit a signal via at least one output interface when said comparison corresponds to a chosen detection and desired recognition.

In a preferred implementation, the method of the present invention for detecting and recognizing impacts includes the following operations:

during said initial learning stage, each of said rates of change is stored in said memory of the system in association with the nature of the known phenomenon which gave rise to said change and which is specific thereto for said surface; and a classification and a selection amongst the phenomena which may cause the impedance to change are established, and said microprocessor is programmed so that during the utilization stage it addresses a given signal to an output interface only for certain rates of change of said impedance.

The result of this is novel method and apparatuses for detecting impacts by measuring rates of change of impedance and the characteristics of such rates of change can be used to satisfy numerous applications, regardless of the environmental conditions thereof.

The main advantage of the present invention is to provide a qualitative measurement of a phenomenon rather than a quantitative measurement. At present no sensors are available capable of reacting to impacts and of discriminating between them.

The device of the invention described below is not a measuring sensor in the proper meaning of the term.

As a result, the present invention can have numerous applications as a switch, a contact, or a detector in fields such as surveillance, security, stock control, sport, fluid mechanics, robotics (artificial skin), acoustics, etc.

Given the low currents used in operation, sensors of the invention can operate under any kind of atmosphere, and even under water, since they present no risk of electrocution.

In addition, the shape of the sensor is of little importance for the operation of the method: it is quite conceivable that the shape of the sensor may be adapted by the end user who fits the sensor over an area which the user defines both in size and in shape, since in the present invention the initial state which determines the "rest" value of the sensor impedance is irrelevant in analyzing variations therein.

The device may be installed on any kind of support or area.

Once installed on a given area, it has been observed that the measured and recorded derivative of the impedance of the sensor is always the same for a given impact regardless of the initial value of said impedance prior to the impact and regardless of other environmental conditions which may also change over time, and in particular regardless of temperature, humidity, or even any load placed on the surface and giving rise to a quasi-permanent deformation of said sensor.

The information sensed is thus a non-quantified image of the phenomenon having qualitative characteristics determined by one or more derivative values optionally associated with a duration and with one or more accelerations, thereby enabling the phenomenon to be classified reliably, and thus making it possible to recognize the phenomenon and select it from amongst other phenomena and to detect any desired action depending on the application.

BRIEF DESCRIPTION OF THE DRAWING

An embodiment of the invention is described by way of example with reference to the accompanying drawing, in which.

DETAILED DESCRIPTION

Figure 1:
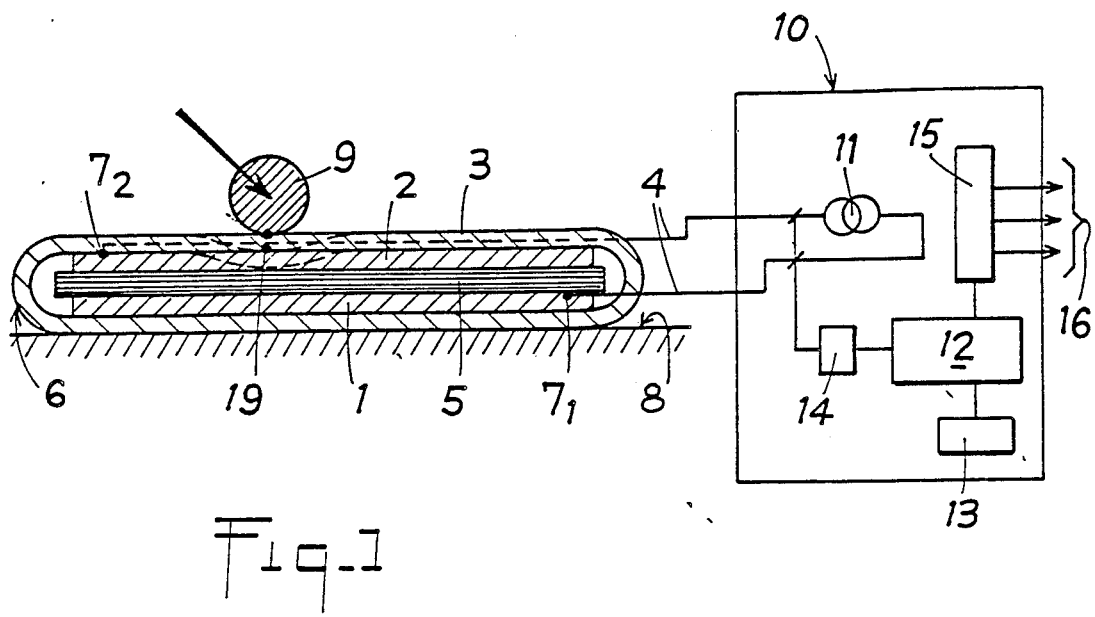
FIG. 1 shows an example of apparatus in accordance with the invention showing a sensor in section and a block diagram of an associated electronic system.
Figure 2:
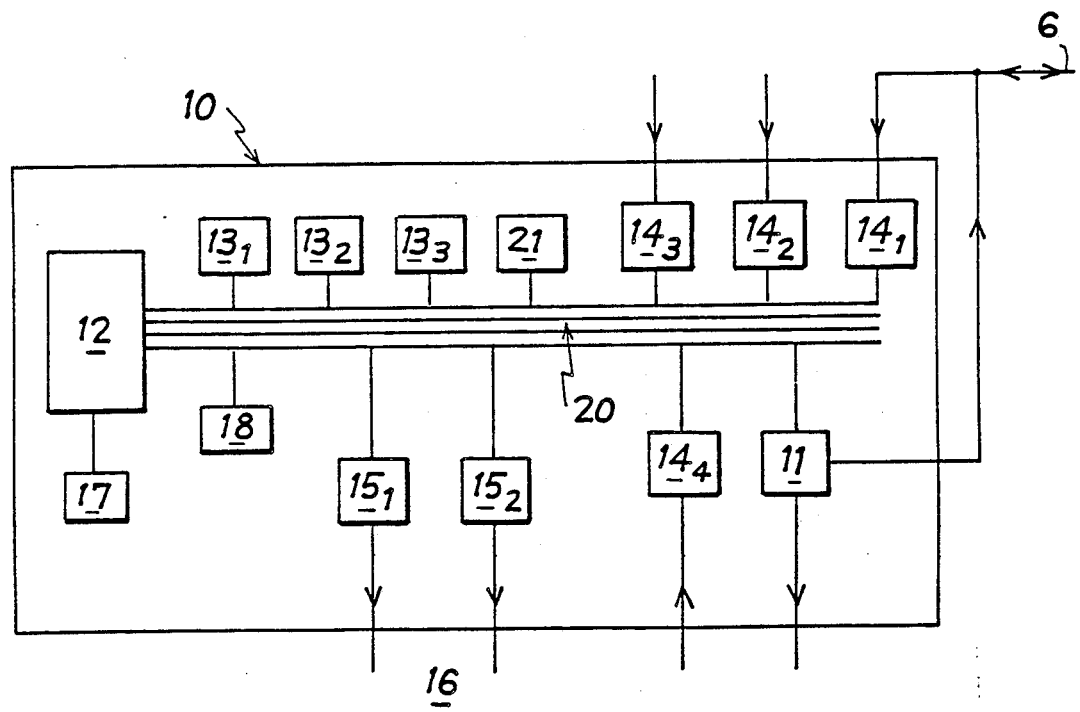
FIG. 2 is a more detailed block diagram of the electronic system.

FIG. 1 includes a section view through a sensor 6 of the invention placed on an arbitrary surface 8 and connected to an electronic circuit 10 for which a more detailed block diagram is shown in FIG. 2.

The sensor 6 is essentially constituted by at least two layers 1 and 2 of conductive material of any type, which materials may be compressible or otherwise, and flexible or otherwise, and which layers are in contact with each other. The layers of material are preferably disposed parallel to each other and they overlie a surface 8 on which the sensor is intended to detect and recognize impacts. Thus, and preferably, said layers are flexible so as to be able to adapt to the shape of said surface and their outside dimensions may be arbitrary.

In a preferred embodiment, said layers are separated by an intermediate layer of material 5. When the layers 1 and 2 are constituted by non-compressible materials, the material in the intermediate layer 5 may be:

either conductive, flexible, compressible, deformable, and elastic, thereby facilitating distinguishing objects 9 which strike the top surface of the sensor 6 at an impact point 19, thereby compressing said intermediate layer 5 to a greater or lesser extent and with a greater or lesser rate of change, and thus setting up a change in impedance which is easily detected and measured;

or else it may be insulating, flexible, and perforated, thereby making it possible to geographically distinguish the location at which the point of impact 19 occurs on the surface of the sensor.

When the layers 1 and 2 are made of compressible, deformable, and elastic material (e.g. a conducting foam), the material of the intermediate layer 5 may be as above, and it may even be non-compressible since compression applies, in any event, to the outer layers.

In another embodiment, a sensor may be constituted by filling a sheath of any shape with a plurality of different pieces of conductive material, such as pieces of foam, thereby constituting a corresponding number of outer and intermediate layers whose ends are connected to the electronic system 10.

In addition, each of the conducting layers 1 or 2 is connected via at least one respective arbitrary point $7_1$ or $7_2$ on its surface via contacts of any conventional type such as rivets, screw terminals, soldering, etc. . . . to a corresponding conductor 4, with each of the conductors 4 being connected in turn to the electronic system 10.

In a preferred embodiment, said points $7_1$ and $7_2$ are as far apart as possible from each other, since the further apart they are, the greater the sensitivity of the device.

In a variant of the invention, these conducting layers 1 and 2 themselves constitute the outside surface of the sensor 6, while in another variant these layers are enclosed and covered in a flexible protective outside surface 3 whose ends and edges are closed by any appropriate means, and the said layers may optionally be fixed to the outside surface.

The thicknesses of said layers and the bodies constituting said outside surfaces may be arbitrary, however they are preferably relatively thin in order to constitute a sensor which is relatively flat and thus does not take up excessive room.

The electronic system 10 includes at least one constant current generator 11 so as to avoid being influenced by the length of the conductors 4 and this generator may produce a very low constant current, e.g. about 20 mA, or even less.

In parallel, and as shown in FIG. 2, for example, said system 10 also includes an analog-to-digital converter 14 which supplies a microprocessor 12 with the value of the potential difference U measured across the terminals of the sensor via the feed wires 4, said value being measured using the equation $U=ZI$ where current I is constant and where Z represents the impedance of the electrical circuit constituted by the sensor 10. At a given instant taken as a "rest" instant, where both impedance and current are constant, the derivative $\delta U$ of the voltage is zero, but when an object 9 strikes the sensor 10, the deformation of the conducting layers 1 and 2, and possibly also of the intermediate layer 5, causes the impedance of the circuit to change, and as a result the derivative of the impedance is then directly proportional to the derivative of the measured voltage:

$$\delta U = f(s)dt$$

since $\delta I = 0$, whence $f(s) =$ the derivative of the impedance.

Tests have shown that a sensor of the invention fitted to a given surface and subjected to a determined impact gives rise to a derivative which is constant, regardless of the value $Z_0$ of the initial impedance of the sensor prior to the impact, thereby making it possible to recognize various types of impact and to select those for which action on external elements 16 is required via an interface 15 while ignoring impacts of no interest to the user. Thus, for use on a tennis court, on which the white lines are provided with apparatus of the invention, the apparatus may act only when a ball strikes the lines, and it need not respond to a player stepping thereon.

To make this possible, it is necessary to perform a learning stage for each given surface and for each utilization, during which a memory 13 associated with the microprocessor 12 is used to store the rates or the derivatives of changes in said impedance corresponding to those impacts which are to be selected or, on the contrary, to those impacts which are to be ignored.

The role of the microprocessor is to calculate the derivative at each instant, and the memory 13 (or some other memory) also contains an application program which, during a utilization stage, makes use of the result of the calculation and compares it with one or more thresholds as fixed or parameterized during the learning stage, in order to trigger or to avoid triggering the desired action.

When initially switched on, the program initializes the system, and it is also possible, providing detected impedance variations always take up the same derivative values during a determined minimum period, to program the microprocessor 12 so that after each impedance variation detected by the sensor, the microprocessor takes the value of the impedance of the sensor corresponding to a derivative having a value of zero as being the rest value of the sensor impedance, after which the microprocessor detects impedance variations created by new impacts only if they give rise to a derivative which differs from said above values.

In addition, the value of the reference impedance of the sensor taken as being the rest value at a given instant may be updated at specified time intervals, e.g. every few microseconds, corresponding to a cycle of the program in said microprocessor 12, and as appropriate for a given application.

In any event, as already mentioned, the method of the invention makes use of the calculated derivative of the value of the impedance rather than the absolute value of the impedance, and as a result any slow variation due to temperature or humidity, for example, gives rise to a derivative which is very small and which is therefore beneath any threshold corresponding to an impact, thus ensuring that an action is not triggered, unless desired.

If greater discrimination is desired in impact analysis, each time a value is recorded for rate of change in the impedance, the time during which said rate of change remains constant may also be recorded together with the derivatives of the rate of change between the "rest" state of the sensor and its return to said state.

FIG. 2 is a more detailed block diagram of one embodiment of the electronic system 10 as shown in FIG. 1, said embodiment being fully equipped for numerous utilizations in accordance with the invention.

It includes various conventional electronic components and the subject matter of the present invention is confined solely to the combination of said components and the method of using them by means of a special program as described above.

FIG. 2 shows the microprocessor 12 which may be an 8-bit CPU operating at 4 MHz and which may be controlled by a supervisor 17 associated with a clock.

The microprocessor is connected via a central bus 20 suitable for subsequently receiving additional extension cards, if necessary, to special cards each corresponding to one of the functions of the system. There are memory cards 13, with at least one of them being suitable for receiving a program for implementing the method of the invention, and another of them being suitable for receiving reference data and comparison data for the impedance derivatives associated with corresponding impacts.

The bus 20 is also connected to a decoding card 21 which may be necessary for certain types of input and output information, and to a baud-rate generator 18.

The constant current generator 11 may be a digital-to-analog converter under the control of the microprocessor and feeding the sensor 6 with a constant current feed at 20 mA, for example, via one of its outputs.

In return, and in parallel, an analog-to-digital converter $14_1$ receives changes in voltage across the terminals of the sensor 6 and it transmits such changes to the microprocessor 12 in order to enable the derivatives thereof to be calculated and compared, after which various output interfaces 15 may be actuated for driving external actuators 16. These output interfaces are suitable for generating high currents for driving relays and they themselves include a certain amount of buffer memory.

Other input cards 14 may be monitored by a single system and may receive information from other external sensors, and in particular one of said cards $14_4$ may be connected to a simple on/off type sensor for acting as a counter, said sensor being made in the manner described in the above description of the invention, and in this case it may be possible to use the impedance of the sensor directly rather than its rate of change or derivative.

This configuration of the electronic circuit 10 is thus suitable for being associated with any type of detection and any type of action, and in particular those specific to the method of the invention, with the method being performed by means of a single electronic system 10 connected to a plurality of sensors and devices as described above.

It should be observed that the methods and devices in accordance with the invention as described above can be used not only for detecting and recognizing impacts, but also for detecting removals, which are phenomena that are symmetrical to impacts and measurable in the same manner, e.g. on an object being taken off a surface.

We claim:

1. A method of detecting and recognizing impacts received by a surface, comprising:
   providing at least two layers of electrically conductive material disposed in contact with each other in order to constitute a sensor, said surface being covered therewith;
   connecting outer surfaces of said layers to a corresponding terminal of an electronic system including at least one constant current generator, said current then flowing through said layers, a microprocessor associated with at least one memory and suitable, in particular, for measuring the potential difference at the terminals of said sensor, and various input/output interfaces;
   calculating the rate of change of the impedance of said sensor, which impedance changes when the sensor is subjected to physical phenomena which differs from an initial situation of the sensor before impact, said rate of change of impedance being directionally proportional to the derivative of the measured potential difference;
   storing during an initial learning stage in said memory of the electronic system, the "rest" impedance value of the sensor corresponding to a said initial situation, and on each change in said impedance during a utilization stage, said microprocessor which is appropriately programmed for the purpose addresses a given signal via an output interface whenever said rate of change exceeds a given threshold;
   storing during said initial learning stage, each of said rates of change in said memory of the system in association with the nature of the known phenomenon which would give rise to said change and each of said rates of change being specific thereto for said surface;
   associating each time during said initial learning stage and then during said utilization stage, the value of the rate of change of the impedance that is calculated and stored with a duration, during which the said rate of change may remain constant, together with the derivatives of the rate of change between the "rest" state of the sensor and its return to said state; and
   establishing a classification and a selection amongst the phenomena which may cause the impedance to change, said microprocessor being programmed so that during the utilization stage it addresses a given signal to an output interface only for preselected characteristics of change of said impedance.

2. A method according to claim 1, wherein after a change in the impedance of the sensor has been detected, and whenever said change subsequently always takes the same values for its derivative during a determined minimum length of time, the microprocessor is programmed so as to take as its new impedance value for the sensor at rest, the impedance value corresponding to the value associated with a zero derivative, and the microprocessor subsequently detects only those changes in impedance which are created by a new impact which produces a derivative which is different from the said values.

3. A method according to claim 1, wherein the rest impedance value of the sensor at a given instant is updated at time intervals such as a few microseconds corresponding to a program cycle of said microprocessor and matched to a given application.

4. Apparatus for detecting and recognizing impacts received by a surface, the apparatus being of the type comprising a pressure sensor associated with an electronic system for the purpose of measuring the impedance of said sensor, wherein said sensor is constituted by at least two layers of electrically conductive material, disposed in contact against each other and covering said surface, with each of the outer layers being connected at at least one arbitrary point on its surface to a terminal of said electronic system, which electronic system includes at least one constant current generator for feeding a constant current through said layers, a microprocessor associated with at least one memory and serving, in particular, to measure the potential difference across the terminals of said sensor, to calculate the derivative of said potential difference, to compare the results obtained with derivative values stored in said memory and each associated with a prior-determined type of impact, and to transmit a signal via at least one output interface when said comparison corresponds to a predetermined impact;

means for calculating the rate of change of the impedance of said sensor, which impedance changes when the sensor is subjected to physical phenomena which differs from an initial situation of the sensor before impact, said rate of change of impedance being directionally proportional to the derivative of the measured potential difference;

means for storing during an initial learning stage, each of said rates of change in said memory of the system in association with the nature of the known phenomena which would give rise to said change and each of said rates of change being specific thereto for said surface;

means for associating each time during said initial learning stage and then during a utilization stage, the value of the rate of change of the impedance that is calculated and stored with a duration, during which the said rate of change may remain constant, together with the derivatives of the rate of change between a "rest" state of the sensor and its return to said state; and means for establishing a classification and a selection amongst the phenomena which may cause the impedance to change, said microprocessor being programmed so that during the utilization stage it addresses a given signal to an output interface only for preselected characteristics of change of said impedance.

5. Apparatus according to claim 4, wherein said at least two layers of material are flexible and compressible, deformable and elastic, and separated by an additional layer of flexible conductive material.

6. Apparatus according to claim 4, wherein said layers of material are flexible and separated by a flexible insulator having perforations.

7. Apparatus according to claim 4, wherein said sensor includes a flexible protective outer surface covering said layers of conductive material.

8. Apparatus according to claim 4, wherein said points via which the layers of conductive material are connected to the electronic system are as far as apart from each other as possible.

9. Apparatus according to claim 4, wherein said sensor is constituted by a sheath of arbitrary shape filled with a plurality of distinct pieces of conductive material constituting a corresponding number of outer layers and intermediate layers when the ends thereof are connected to the electronic system.

* * * * *